US008128753B2

(12) United States Patent
Bulovic et al.

(10) Patent No.: US 8,128,753 B2
(45) Date of Patent: Mar. 6, 2012

(54) METHOD AND APPARATUS FOR DEPOSITING LED ORGANIC FILM

(75) Inventors: Vladimir Bulovic, Lexington, MA (US); Marc A. Baldo, Cambridge, MA (US); Martin A. Schmidt, Reading, MA (US); Valerie LeBlanc, Cambridge, MA (US); Jianglong Chen, San Jose, CA (US)

(73) Assignee: Massachusetts Institute of Technology, Cambridge, MA (US)

( * ) Notice: Subject to any disclaimer, the term of this patent is extended or adjusted under 35 U.S.C. 154(b) by 1009 days.

(21) Appl. No.: 11/282,472

(22) Filed: Nov. 21, 2005

(65) Prior Publication Data

US 2006/0115585 A1 Jun. 1, 2006

Related U.S. Application Data

(60) Provisional application No. 60/629,312, filed on Nov. 19, 2004.

(51) Int. Cl.
*C23C 14/12* (2006.01)

(52) U.S. Cl. .......... 118/722; 118/726; 118/50; 118/302; 118/308

(58) Field of Classification Search .................... 118/50, 118/302, 308, 726, 722, 723 R, 723 E; 347/47, 347/97, 56, 60, 61, 83, 26, 27, 55, 68; 239/102.1, 239/102.2, 596, 589.1
See application file for complete search history.

(56) References Cited

U.S. PATENT DOCUMENTS

| | | | | |
|---|---|---|---|---|
| 4,751,531 | A * | 6/1988 | Saito et al. | 347/55 |
| 5,155,502 | A | 10/1992 | Kimura et al. | |
| 5,172,139 | A | 12/1992 | Sekiya et al. | |
| 5,202,659 | A | 4/1993 | DeBonte et al. | |
| 5,623,292 | A | 4/1997 | Shrivastava et al. | |

(Continued)

FOREIGN PATENT DOCUMENTS

JP 06-122201 5/1994

(Continued)

OTHER PUBLICATIONS

Street et al., "Jet Printing of Active-Matrix TFT Backplanes for Displays and Sensors", *IS&T Archiving*, Dec. 2005, vol. 20, No. 5, 16 pages.

(Continued)

*Primary Examiner* — Laura Edwards
(74) *Attorney, Agent, or Firm* — Dianoosh Salehi; Jeffrey D. Frazier

(57) ABSTRACT

In one embodiment the disclosure relates to an apparatus for depositing an organic material on a substrate, including a source heater for heating organic particles to form suspended organic particles; a transport stream for delivering the suspended organic particles to a discharge nozzle, the discharge nozzle having a plurality of micro-pores, the micro-pores providing a conduit for passage of the suspended organic particles; and a nozzle heater for pulsatingly heating the micro-pores nozzle to discharge the suspended organic particles from the discharge nozzle.

25 Claims, 5 Drawing Sheets

U.S. PATENT DOCUMENTS

| | | | |
|---|---|---|---|
| 5,781,210 A | 7/1998 | Hirano et al. | |
| 5,865,860 A | 2/1999 | Delnick | |
| 5,947,022 A | 9/1999 | Freeman et al. | |
| 6,065,825 A * | 5/2000 | Anagnostopoulos et al. | 347/44 |
| 6,086,195 A * | 7/2000 | Bohorquez et al. | 347/93 |
| 6,086,196 A | 7/2000 | Ando et al. | |
| 6,095,630 A | 8/2000 | Horii et al. | |
| 6,250,747 B1 | 6/2001 | Hauck | |
| 6,257,706 B1 | 7/2001 | Ahn | |
| 6,460,972 B1 | 10/2002 | Trauernicht et al. | |
| 6,601,936 B2 | 8/2003 | McDonald | |
| 6,824,262 B2 * | 11/2004 | Kubota et al. | 347/100 |
| 6,896,346 B2 | 5/2005 | Trauernicht et al. | |
| 7,077,513 B2 | 7/2006 | Kimura et al. | |
| 7,374,984 B2 | 5/2008 | Hoffman | |
| 7,377,616 B2 | 5/2008 | Sakurai | |
| 7,404,862 B2 | 7/2008 | Shtein et al. | |
| 7,431,968 B1 | 10/2008 | Shtein et al. | |
| 7,648,230 B2 | 1/2010 | Kachi | |
| 7,677,690 B2 | 3/2010 | Takatsuka | |
| 2001/0045973 A1 * | 11/2001 | Sharma et al. | 347/54 |
| 2002/0008732 A1 | 1/2002 | Moon et al. | |
| 2002/0191063 A1 | 12/2002 | Gelbart et al. | |
| 2004/0009304 A1 | 1/2004 | Pichler | |
| 2004/0086631 A1 | 5/2004 | Han | |
| 2004/0202794 A1 | 10/2004 | Yoshida | |
| 2005/0255249 A1 | 11/2005 | Schlatterbeck | |
| 2007/0040877 A1 | 2/2007 | Kachi | |
| 2007/0058010 A1 | 3/2007 | Nagashima | |
| 2008/0299311 A1 | 12/2008 | Shtein et al. | |
| 2008/0311296 A1 | 12/2008 | Shtein et al. | |
| 2008/0311307 A1 | 12/2008 | Bulovic et al. | |
| 2010/0079513 A1 | 4/2010 | Taira et al. | |

FOREIGN PATENT DOCUMENTS

| | | |
|---|---|---|
| JP | 2002-069650 | 3/2002 |
| JP | 2005-286069 | 10/2005 |
| JP | 2006-123551 | 5/2006 |
| JP | 2006-150900 | 6/2006 |
| JP | 2007-095343 | 4/2007 |
| JP | 2007-299616 | 11/2007 |
| KR | 100232852 | 12/1999 |
| KR | 10-2008-0060111 | 7/2007 |
| WO | WO 2005/090085 | 9/2005 |

OTHER PUBLICATIONS

Forrest, Stephen R., "The Path to Ubiquitous and Low-cost Organic Electronic Appliances on Plastic," *Nature*, Apr. 29, 2004, vol. 428, 8 pages.

Leblanc et al., "Micromachined Printheads for the Evaporative Patterning of Organic Materials and Metals," *Journal of Microelectromechanical Systems*, Apr. 2007, vol. 16, No. 2, 7 pages.

Lindermann et al., "Thermal Bubble Jet Printhead with Integrated Nozzle Plate," *NIP20: International Conference on Digital Printing Technologies*, Oct. 2004, p. 834-839.

Chen, Jianglong, "Novel Patterning Techniques for Manufacturing Organic and Nanostructured Electronics," *M.S. Materials Science and Engineering*, Massachusetts Institute of Technology, 2003, pp. 1-206.

Chen, Jingkuang et al., "A High-Resolution Silicon Monolithic Nozzle Array for Inkjet Printing," *IEEE Transactions on Electron Devices*, vol. 44, No. 9, Sep. 1997, pp. 1401-1409.

International Preliminary Report on Patentability issued on Dec. 7, 2009 for PCT Application No. PCT/US08/066991.

International Preliminary Report on Patentability issued on Dec. 17, 2009 for PCT Application No. PCT/US08/67002.

International Preliminary Report on Patentability issued on Dec. 17, 2009 for PCT Application No. PCT/US08/66975.

EP Examination Report dated Jul. 30, 2010 issued for EP Patent Application 08771068.7.

CN Office Action dated Oct. 12, 2010 issued for CN Patent Application 200880020197.8.

EP Examination Report dated Jul. 13, 2010 issued for EP Patent Application 08771094.3.

CN Office Action dated Dec. 17, 2010 issued for CN Patent Application 200880020151.6.

EP Examination Report dated Jul. 13, 2010 issued for EP Patent Application 08771084.4.

International Search Report issued on Dec. 15, 2010 for PCT Application No. PCT/US10/020144.

International Search Report issued on Sep. 2, 2010 for PCT Application No. PCT/US10/033315.

International Search Report and Written Opinion issued on Mar. 24, 2011 for PCT Application No. PCT/US10/058145.

Chen et al., "Evaporative Deposition of Molecular Organics in Ambient with a Molecular Jet Printer," *Digital Fabrication*, Sep. 2006, pp. 63-65.

Chen et al., "Ambient Environment Patterning of Organic Thin Films by a Second Generation Molecular Jet (MoJet) Printer," *Progress Report 2006-2007*, Oct. 2007, Chapter 26, pp. 6-7.

CN Office Action dated Jan. 12, 2011 issued for CN Patent Application 200880019990.6.

US Non-Final Office Action issued for U.S. Appl. No. 12/139,391 on Jun. 7, 2011.

US Non-Final Office Action issued for U.S. Appl. No. 12/139,404 on Jun. 24, 2011.

* cited by examiner

Functional Blocks:

1. Material Delivery to a Local Evaporator
   (gas delivery of evaporated material)

2. On -Demand Local Evaporation
   - to minimize substrate heating
   - to maximize material use
   - to minimize nozzle clogging Functional Blocks:

1. Material Delivery to a Local Evaporator
   (liquid delivery of solvated material)

2. On - Demand Local Evaporation
   - to minimize substrate heating
   - to maximize material use
   - to minimize nozzle clogging (a) (b)

(a) (b)

(a) cross-section and (b) top view

METHOD AND APPARATUS FOR DEPOSITING LED ORGANIC FILM

The disclosure claims the filing-date priority to the Provisional Application No. 60/629,312, filed Nov. 19, 2004, the specification of which is incorporated herein in its entirety.

BACKGROUND

The disclosure relates to a method and apparatus for depositing an organic film on a substrate. Manufacturing light emitting diode (LED) cell requires depositing of two thin organic films on a substrate and coupling each of the thin films to an electrode. Conventionally, the deposition step is carried out by evaporating the desired organic film on the substrate. The film thickness is a prime consideration. The layer thickness is about 100 nm and each layer is optimally deposited to an accuracy of about ±10 nm. As a result, conventional apparatus form multiple layers on a substrate with each layer having a thickness of about 10 nm. A combination of these layers will form the overall film. Because the organic constituents of the LED are often suspended in a solvent, removing the solvent prior to depositing each layer is crucial. A small amount of solvent in one layer of deposited organic thin film can cause contamination and destruction of the adjacent layers. Conventional techniques have failed to address this deficiency.

Another consideration in depositing organic thin films of an LED device is placing the films precisely at the desired location. Conventional technologies use shadow masking to form LED films of desired configuration. The shadow masking techniques require placing a well-defined mask over a region of the substrate followed by depositing the film over the entire substrate. Once deposition is complete, the shadow mask is removed to expose the protected portions of the substrate. Since every deposition step starts by forming a shadow mask and ends with removing and discarding the mask, a drawback of shadow masking technique is inefficiency.

SUMMARY OF THE DISCLOSURE

In one embodiment the disclosure relates to an apparatus for depositing an organic material on a substrate, the apparatus comprising: a source heater for heating organic particles to form suspended organic particles; a transport stream for delivering the suspended organic particles to a discharge nozzle, the discharge nozzle having a plurality of micro-pores, the micro-pores providing a conduit for passage of the suspended organic particles; and a nozzle heater for pulsatingly heating the nozzle to discharge the suspended organic particles from the discharge nozzle.

According to another embodiment, the disclosure relates to a method for depositing a layer of substantially solvent-free organic material on a substrate, comprising heating the organic material to form a plurality of suspended organic particles; delivering the suspended organic particles to a discharge nozzle, the discharge nozzle having a plurality of micro-pores for receiving the suspended organic particles; and energizing the discharge nozzle to pulsatingly eject the suspended organic particles from the discharge nozzle. Organic particle may include an organic molecule or a molecular aggregate.

According to another embodiment, the disclosure relates to a method for depositing a layer of organic material on a substrate. The organic material may be suspended in solvent to provide crystal growth or to convert an amorphous organic structure into a crystalline structure. The method can include heating the organic material to form a plurality of suspended organic particles; delivering the suspended organic particles to a discharge nozzle, the discharge nozzle having a plurality of micro-pores for receiving the suspended organic particles; and energizing the discharge nozzle to pulsatingly eject the suspended organic particles from the discharge nozzle. Organic particle may include an organic molecule or a molecular aggregate.

According to still another embodiment, the disclosure relates to an apparatus for depositing an organic compound on a substrate comprising a chamber having a reservoir for receiving the organic compound, the chamber having an inlet and an outlet for receiving a transport gas; a discharge nozzle having a plurality of micro-porous conduits for receiving the organic compound delivered by the transport gas; and an energy source coupled to the discharge nozzle to provide pulsating energy adapted to discharge at least a portion of the organic compound from one of the micro-porous conduits to a substrate.

In yet another embodiment, an apparatus for depositing an organic compound comprises a chamber having a reservoir for housing the organic material dissolved in a solvent, the reservoir separated from the chamber through an orifice; a discharge nozzle defined by a plurality of micro-porous conduits for receiving the organic compound communicated from the reservoir; and an energy source coupled to the discharge nozzle providing pulsating energy for discharging at least a portion of the organic compound from one of the micro-porous conduits to a substrate; and a delivery path connecting the chamber and the nozzle. The organic compound may be substantially free of solvent. Alternatively, the organic compound may include in solvent. In a solvent-based system, the solvent discharge from the nozzle provides the added benefit of cooling the nozzle upon discharge.

In still another embodiment, a micro-porous nozzle for depositing an organic composition on a substrate includes a thermal source communicating energy to organic material interposed between the heater and a porous medium, the porous medium having an integrated mask formed thereon to define a deposition pattern.

DETAILED DESCRIPTION

In one embodiment, the disclosure relates to a method and apparatus for depositing a pure organic thin film, or a mixed organic film, or an organic thin film mixed with inorganic particles, or inorganic thin film on a substrate. Such films can be used, among others, in the design and construction of organic LED.

Figure 1:
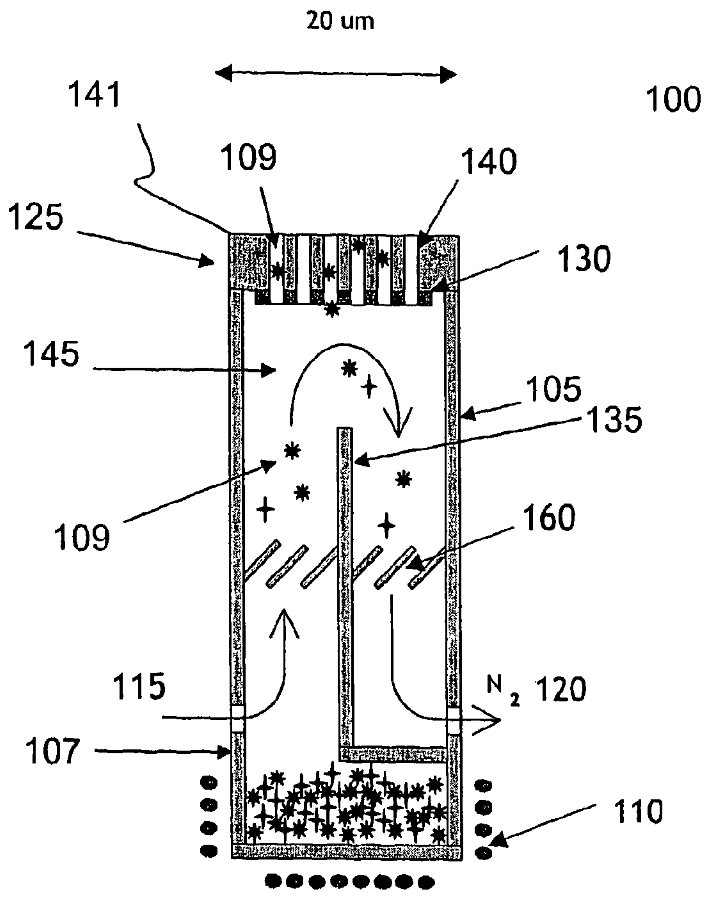
FIG. 1 is a schematic representation of a discharge apparatus for discharging organic compounds, or its mixture, according to one embodiment of the disclosure.

FIG. 1 is a schematic representation of a discharge apparatus for discharging organic compounds, or its mixture, according to one embodiment of the disclosure. Referring to FIG. 1, exemplary apparatus for deposing an organic material on a substrate includes housing 105 having discharge nozzle 125 at one end and a reservoir 107 at another end. Reservoir 107 may contain organic constituents required for forming an LED film. The organic constituent may be liquid or solid. Heat source 110 is provided to heat reservoir 107 and the content thereof. Heat source 110 can provide heating of about 100-700° C. In another embodiment, the heat source 110 can provide heating of about 300-500° C.

Housing 105 may optionally include inlet 115 and outlet 120. The inlet and outlet can be defined by a flange adapted to receive a carrier gas (interchangeably, transport gas.) In one embodiment, the carrier gas is a inert gas such as nitrogen or argon. Delivery path 135 can be formed within housing 105 to guide the flow of the carrier gas. Thermal shields 160 may be positioned to deflect thermal radiation from hear source 110 to thereby protect discharge nozzle 125 and organic particles contained therein.

In the exemplary embodiment of FIG. 1, the discharge section includes discharge nozzle 125 and nozzle heater 130. Among others, the discharge nozzle can be formed from anodized porous aluminum oxide or porous silicon membranes or other solid membranes. Such material are capable of blocking organic material from escaping through the porous medium when the organic material is delivered onto the porous medium's surface. Discharge nozzle 125 includes rigid portions 141 separated by micro-pores 140. Micro-pores 140 block organic material from escaping through the medium until the medium is appropriately activated. Depending on the desired application, micro-pores 140 can provide conduits (or passages) in the order of micro- or nano-pores. In one embodiment, the pore size is in the range of about 5 nm-500 microns. In another embodiment, the pores are about 5 nm-100 nm. In another embodiment, the pores are about 100 nm-1 micron. In another embodiment, the pores are about 5 nm-500 microns. In another embodiment pores are about 100 nm to about 10 microns. Nozzle heater 130 is positioned proximal to the discharge nozzle 125. When activated, nozzle heater 130 provides a pulse of energy, for example as heat, to discharge nozzle 125. The activation energy of the pulse dislodges organic material 109 contained within micro-pores 140.

In a method according to one embodiment of the disclosure, reservoir 107 is commissioned with organic material suitable for LED deposition. The organic material may be in liquid or solid form. Source heater 110 provides heat adequate to evaporate the organic material and form suspended particles 109. By engaging a carrier gas inlet 115, suspended particles 109 are transported through thermal shields 160 toward discharge nozzle 125. The carrier gas is directed to gas outlet 120 through delivery path 135. Particles 109 reaching discharge nozzle are lodged in micro-pores 130. Activating nozzle heater 130 to provide energy to discharge nozzle 125 can cause ejection of organic particles 109 from the discharge nozzle. Nozzle heater 130 can provide energy in cyclical pulses. The intensity and the duration of each pulse can be defined by a controller (not shown.) The activating energy can be thermal energy. A substrate can be positioned immediately adjacent to discharge nozzle 125 to receive the ejected organic particles. Applicants have discovered that the exemplary embodiment shown in FIG. 1 can form a think organic film on a substrate with great accuracy. The embodiment of FIG. 1 is also advantageous in that it can substantially reduce substrate heating, minimizes local clogging and provide the most efficient use of organic material.

Figure 2:
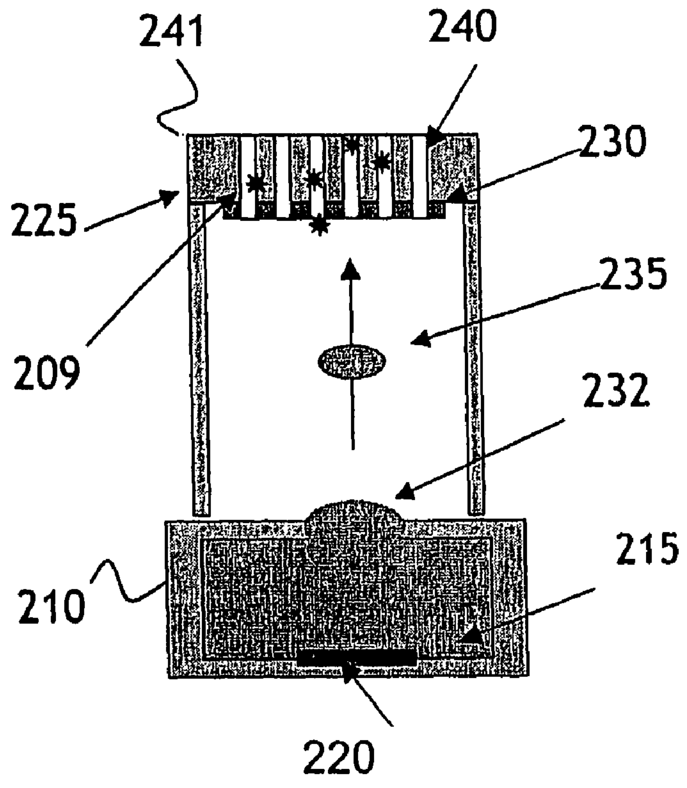
FIG. 2 is a schematic representation of a discharge apparatus for discharging organic compounds according to another embodiment of the disclosure.

FIG. 2 is a schematic representation of a discharge apparatus for discharging organic compounds according to another embodiment of the disclosure. Referring to FIG. 2, apparatus 200 is adapted for forming an organic film substantially free from solvent. Apparatus 200 includes reservoir 210 for receiving organic solution 215. In one embodiment, organic solution 215 contains organic material dissolved in a solvent. Thermal resistor 220 is positioned proximal to reservoir 210 to heat organic solution 215. Orifice 232 separates reservoir 210 from discharge nozzle 225. Discharge nozzle 225 comprises micro-pores 240 separated by rigid sections 241.

Because of the size of orifice 232, surface tension of organic solution prevents discharge of organic solution 215 from the reservoir until appropriately activated. Once thermal resistor 220 is activated, energy in the form of heat causes evaporation of droplet 235 within a chamber of apparatus 200. Solvents have a lower vapor pressure and evaporate rapidly. Once evaporates, organic compound within droplet 235 is transported to discharge nozzle 225. Discharge nozzle 225 receives the organic material 209 within micro-pores 240. The solvent can be recycled back to organic solution 215 or can be removed from the chamber (not shown). By activating nozzle heater 230, micro-pores 240 dislodge organic particles 209, thereby forming a film on an immediately adjacent substrate (not shown.) In one embodiment, nozzle heater 230 can be activated in a pulse-like manner to provide heat to discharge nozzle cyclically.

Figure 3:
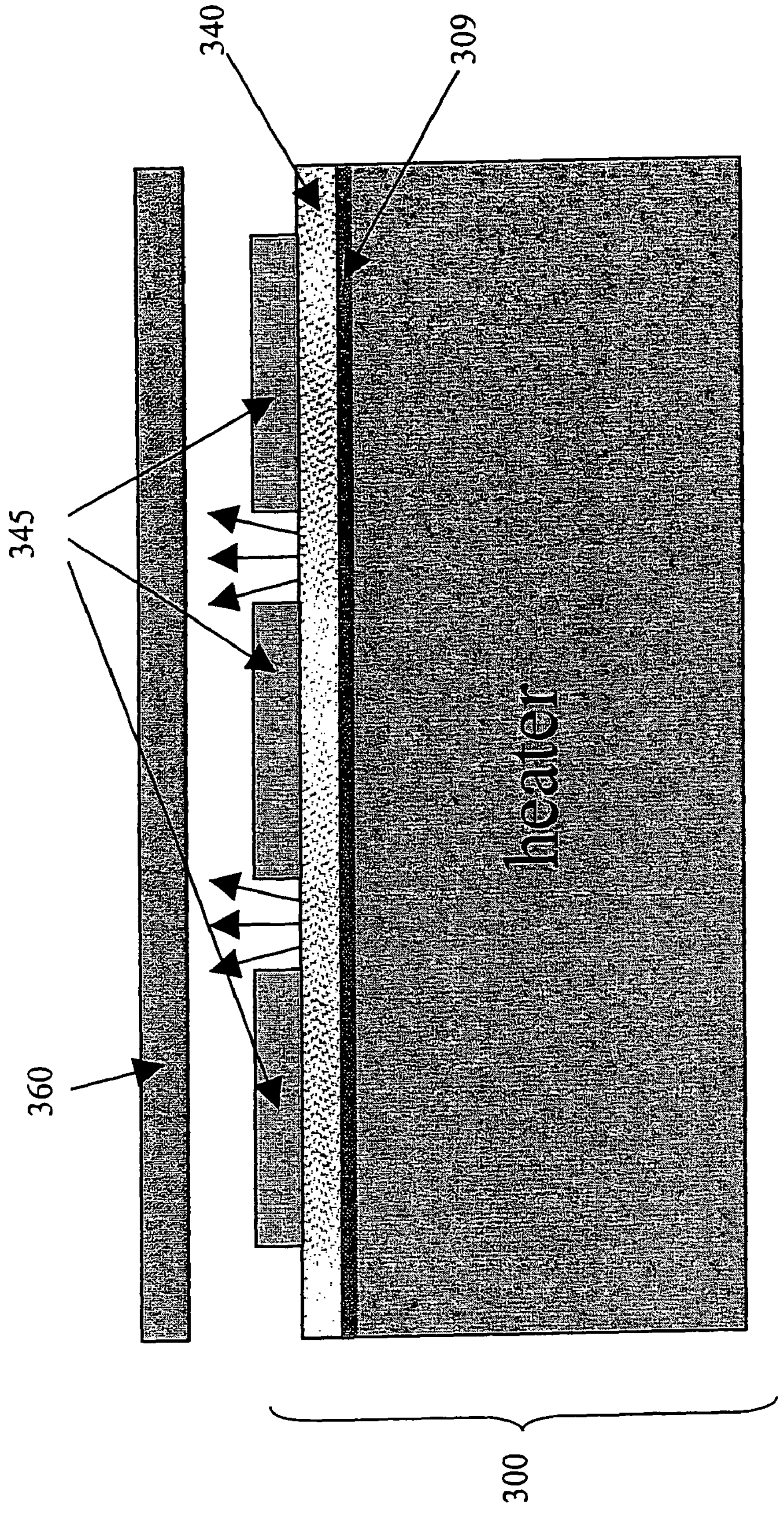
FIG. 3 schematically illustrates a discharge nozzle according to one embodiment of the disclosure.

FIG. 3 schematically illustrates a discharge nozzle according to one embodiment of the disclosure. In FIG. 3, discharge nozzle 300 comprises heater 330, porous medium 340 and integrated mask 345. Heater 330 is communicates pulse energy in the form of heat to organic material 309 causing dislodge thereof from porous medium 340. Integrated mask 345 effectively masks portions of the porous medium from transmitting organic ink material 309. Consequently, a film forming on substrate 360 will define a negative image of the integrated mask.

Thus, in one embodiment, the particles can be discharged from the porous medium by receiving thermal energy from a proximal resistive heater, or a thermal radiation heater, or by electrostatic force pull out of the micro-porous, or by mechanical vibration.

Figure 4:
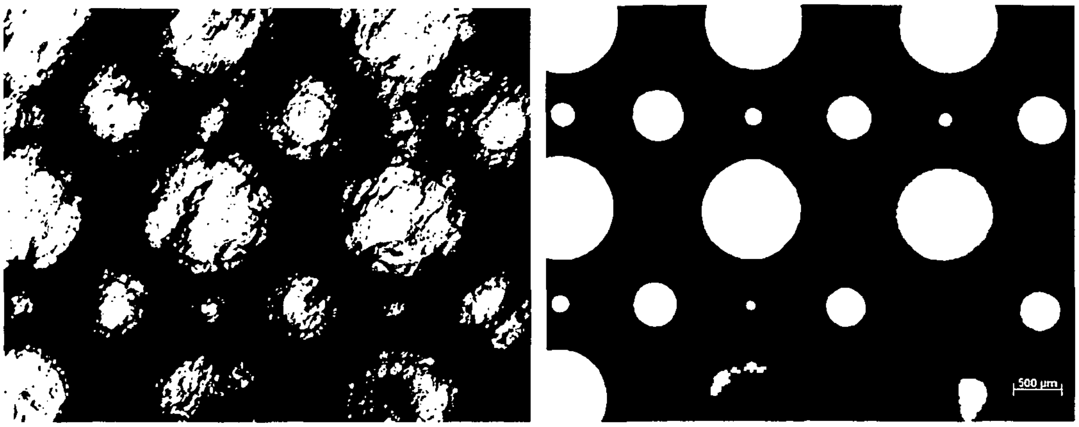
FIGS. 4A and 4B show an image printed according to one embodiment of the disclosure.

FIGS. 4A and 4B show an image printed according to one embodiment of the disclosure. Specifically, FIG. 4 shows the printing result using the exemplary apparatus shown in FIG. 3. The ink material is Alq3 and was pre-coated on the backside of an anodized porous alumina disc. FIG. 4A shows the LED organic printed pattern under halogen illumination. FIG. 4B shows the photoluminescence image under UV illumination.

Figure 5:
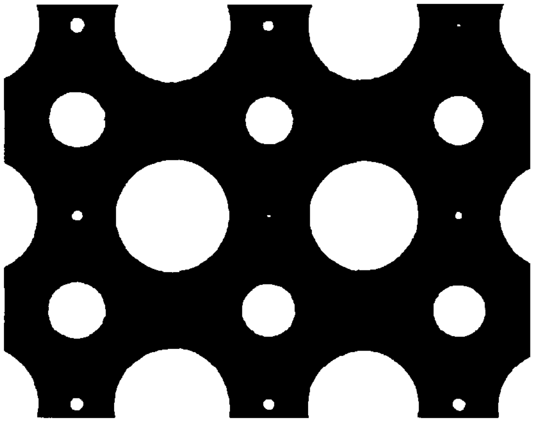
FIG. 5 is a photoluminescence image of a pattern printed by molecular jet printer system.

FIG. 5 is a photoluminescence image of a pattern printed by molecular jet printer system according to another embodiment of the disclosure. FIG. 5 was obtained by using the discharge nozzle shown in FIG. 3. The ink material was Alq3. The ink material was drop cast on the backside of anodized porous alumina disc.

Figure 6:
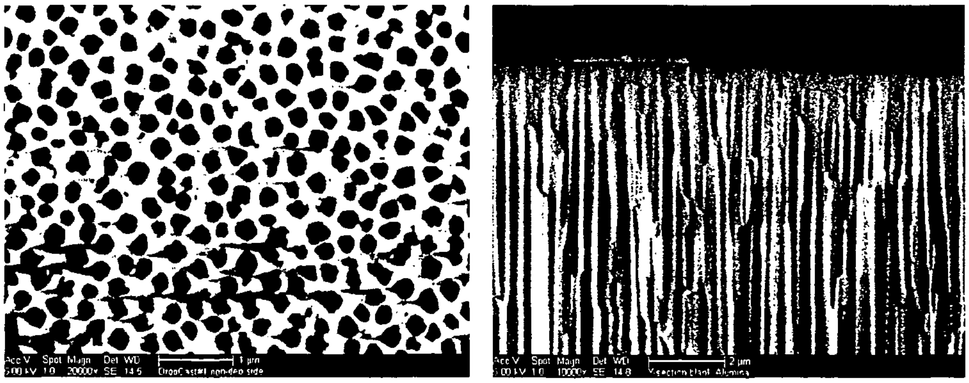
FIGS. 6A and 6B show the surface and the cross section, respectively, of a porous medium.

FIGS. 6A and 6B show the surface and the cross section, respectively, of a porous medium. The porous medium can be used according to the principles disclosed herein with a discharge nozzle or as a part of a nozzle having an integrated mask (see FIG. 3.) FIG. 6A shows the surface of the porous medium. FIG. 6B shows a cross-section of the porous medium. FIG. 6A shows a scale of 1 μm and FIG. 6B has a scale of 2 μm.

Figure 7B:
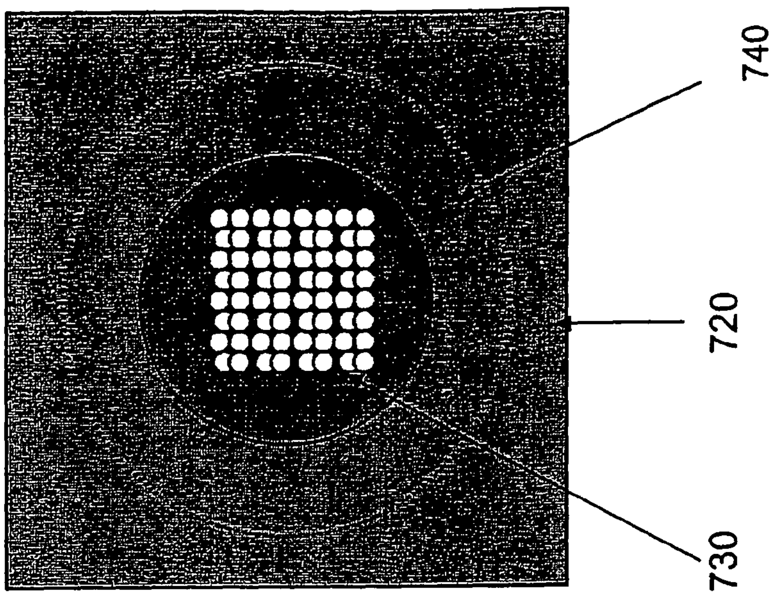
FIGS. 7A and 7B illustrate a molecular jet printing apparatus according one embodiment of the disclosure in cross-sectional and top views, respectively.
Figure 7A:
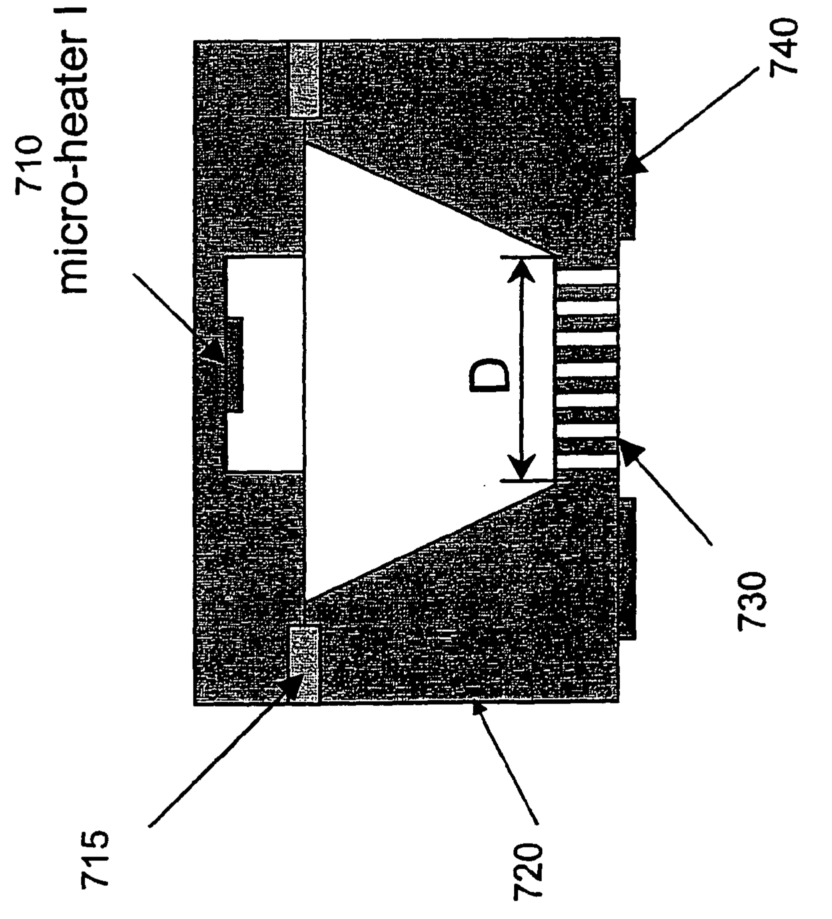

FIGS. 7A and 7B illustrate a molecular jet printing apparatus according to an embodiment of the disclosure in cross-sectional and top views, respectively. Referring to FIG. 7A, printing apparatus 700 includes micro-heater 710 which can be used as a liquid delivery system. Wafer bonding layer 715 connects the liquid delivery system to nozzle section 720. Porous openings 730 are positioned at a discharge end of nozzle 720 and micro-heaters 740 are positioned adjacent to porous openings 730 to providing energy required to eject organic material or ink from nozzle 720. FIG. 7B shows a top view of the nozzle shown in FIG. 7A including porous openings 730 and heaters 740.

While the principles of the disclosure have been illustrated in relation to the exemplary embodiments shown herein, the principles of the disclosure are not limited thereto and include any modification, variation or permutation thereof.

What is claimed is:

1. An apparatus for depositing a thin film of an organic material on a substrate, the apparatus comprising:

a housing defining a first end and a second end and a plurality of baffles interposed therebetween, the housing having an inlet;

a reservoir communicating with the first end of the apparatus, the reservoir storing the organic material;

a discharge nozzle having a plurality of micro-pores provided at the second end of the housing;

a source heater heating the organic material to form organic particles that migrate from the reservoir to the discharge nozzle; and a pulsing nozzle heater heating the discharge nozzle for discharging the suspended organic particles from the discharge nozzle through the micro-pores.

2. The apparatus of claim 1, further comprising at least one thermal baffle.

3. The apparatus of claim 1, further comprising a transport stream for delivering the suspended organic particles to the discharge nozzle, wherein the transport stream is a gas.

4. The apparatus of claim 3, wherein the transport stream is an inert gas.

5. The apparatus of claim 1, wherein the organic material further comprises a solvent.

6. The apparatus of claim 1, wherein the discharge nozzle defines the plurality of micro-pores separated by a rigid structure.

7. The apparatus of claim 1, wherein the organic material defines a solvent-based composition.

8. The apparatus of claim 1, wherein the organic material defines a composition having an organic material and an inorganic material.

9. An apparatus for depositing an organic material comprising:

a housing having a micro-porous membrane with a first surface and a second surface and a layer of organic particles provided on the first surface of the micro-porous membrane; and a means for supplying pulsing energy to the layer of organic material provided in the proximity of the first side of the micro-porous membrane;

wherein the pulsing energy transports the organic material through the micro-porous membrane from the first surface of the micro-porous membrane to the second surface through at least one baffle.

10. The apparatus of claim 9, wherein the pulsating energy is supplied cyclically.

11. The apparatus of claim 9, wherein the apparatus is configured to eject said organic particles from the second surface.

12. The apparatus of claim 9, wherein the organic particles define at least one molecule.

13. The apparatus of claim 9, wherein the organic particles define a molecular aggregate.

14. The apparatus of claim 9, further comprising a gas transport configured to form a coating having at least one organic particle.

15. The apparatus of claim 9, further comprising a liquid solvent system configured to form the coating having at least one organic particle.

16. The apparatus of claim 9, wherein the apparatus is configured to operate in a relative vacuum.

17. The apparatus of claim 9, wherein the micro-porous membrane further comprises pores of about 5 nm-100 nm.

18. The apparatus of claim 9, wherein the micro-porous membrane further comprises pores of about 100 nm-1 micron.

19. The apparatus of claim 9, wherein the micro-porous membrane further comprises pores of about 5 nm-500 micron.

20. The apparatus of claim 9, wherein the micro-porous membrane further comprises pores of about 100 nm-10 micron.

21. The apparatus of claim 9, wherein the heater provides pulsing heat about 100-700° C.

22. The apparatus of claim 9, wherein the heater provides pulsing heat about 300-500° C.

23. The apparatus of claim 9, wherein means for supplying pulsing energy is a resistive heater and the pulsing energy is a thermal energy.

24. The apparatus of claim 23, wherein the heater is in contact with the layer of organic material.

25. The apparatus of claim 9, wherein the pulsing energy is a mechanical vibration energy.

* * * * *